US007732299B2

(12) United States Patent
Chang et al.

(10) Patent No.: US 7,732,299 B2
(45) Date of Patent: Jun. 8, 2010

(54) PROCESS FOR WAFER BONDING

(75) Inventors: Fa-Yuan Chang, Taipei (TW);
Tsung-Mu Lai, Chu-Pei (TW);
Kai-Chih Liang, Zhubei (TW);
Hua-Shu Wu, Hsinchu (TW);
Chin-Hsiang Ho, Hsinchu (TW);
Gwo-Yuh Shiau, Hsinchu (TW);
Chu-Wei Cheng, Pingjhen (TW);
Ming-Chyi Liu, Hsinchu (TW);
Yuan-Chih Hsieh, Hsinchu (TW);
Chia-Shiung Tsai, Hsin-Chu (TW);
Nick Y. M. Shen, Chu-Pei (TW);
Ching-Chung Pai, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 530 days.

(21) Appl. No.: 11/673,652

(22) Filed: Feb. 12, 2007

(65) Prior Publication Data
US 2008/0194076 A1     Aug. 14, 2008

(51) Int. Cl.
*H01L 21/338*     (2006.01)
*H01L 21/30*      (2006.01)
*H01L 21/46*      (2006.01)
(52) U.S. Cl. .................. 438/455; 438/183; 438/926; 257/E21.453
(58) Field of Classification Search ............ 438/183, 438/455, 926; 257/E21.453
See application file for complete search history.

(56) References Cited
U.S. PATENT DOCUMENTS 5,213,986 A     5/1993  Pinker et al.
6,025,270 A     2/2000  Yoo
6,261,883 B1 *  7/2001  Koubuchi et al. ........... 438/197
6,764,919 B2 *  7/2004  Yu et al. ..................... 438/421
2005/0026405 A1  2/2005  Koubuchi et al.
2005/0127496 A1*  6/2005  Kwon et al. ................. 257/700
2006/0252229 A1* 11/2006  Joly et al. ................... 438/455

FOREIGN PATENT DOCUMENTS
KR     1998047252     9/1998

OTHER PUBLICATIONS

Ying-Chou Cheng et al., "A MEMS micromirror fabricated using CMOS post-process", www.sciencedirect.com, 2005, 9 pages.
KIPO, Notice of Preliminary Rejection, Application No. 10/2007-0133365, May 29, 2009, 10 pages.
Chinese Office Action issued Mar. 13, 2009, Application No. 200710199506.

* cited by examiner

*Primary Examiner*—Alexander G Ghyka
*Assistant Examiner*—Seahvosh J Nikmanesh
(74) *Attorney, Agent, or Firm*—Haynes and Boone, LLP

(57) ABSTRACT

The present disclosure provide a method of manufacturing a microelectronic device. The method includes forming a top metal layer on a first substrate, in which the top metal layer has a plurality of interconnect features and a first dummy feature; forming a first dielectric layer over the top metal layer; etching the first dielectric layer in a target region substantially vertically aligned to the plurality of interconnect features and the first dummy feature of the top metal layer; performing a chemical mechanical polishing (CMP) process over the first dielectric layer; and thereafter bonding the first substrate to a second substrate.

20 Claims, 19 Drawing Sheets

PROCESS FOR WAFER BONDING

BACKGROUND

In semiconductor technology, a semiconductor substrate can be bonded to another substrate in applications such as the fabrication of a back-illuminated imaging device or a micro-electro mechanical system (MEMS). While having a second, bonded substrate can facilitate the processing of the semiconductor substrate, it can produce additional difficulties. For example, a polishing process often cannot achieve expected surface flatness when using a second, bonded substrate due to bonding quality issues such as air bubbles and delaminations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
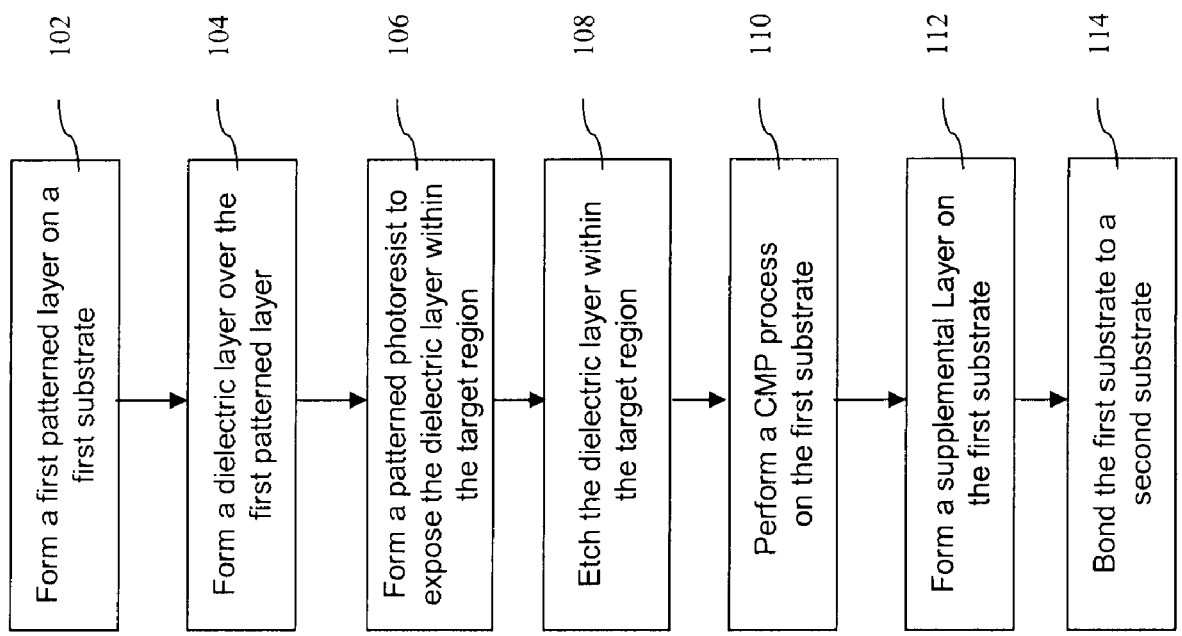
FIG. 1 is a flowchart of one embodiment of a method to form an integrated circuit (IC).
Figure 2:
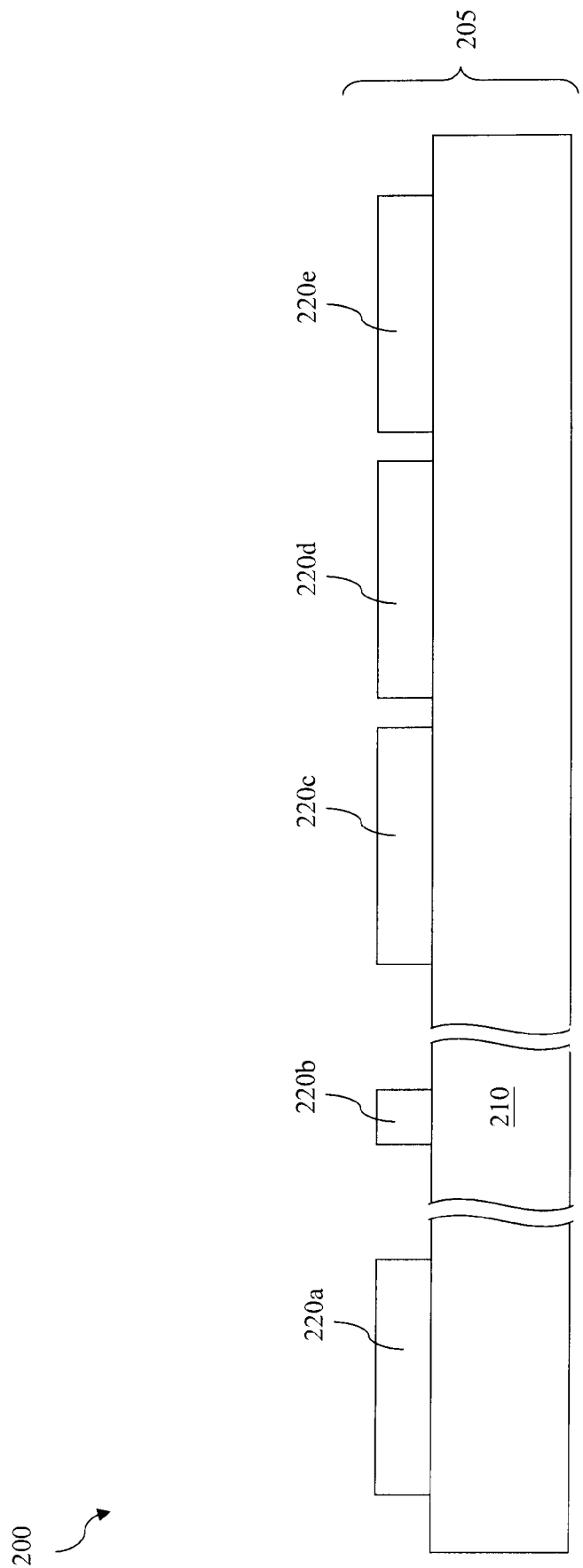
FIGS. 2 through 8 illustrate sectional side views of an exemplary integrated circuit during various fabrication stages, made by the method of FIG. 1.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of one embodiment of a method 100 to form an integrated circuit. FIGS. 2 through 8 illustrate sectional side views of an exemplary integrated circuit 200 during various fabrication stages and made by the method 100. With reference to FIGS. 1 through 8, the method 100 and the exemplary integrated circuit 200 are collectively described below. It is understood that additional steps can be provided before, during, and after the method 100, and some of the steps described below can be replaced or eliminated, for additional embodiments of the method.

The method begins at step 102 by providing a first wafer 200. The first wafer 205 includes a first substrate 210. The substrate 210 includes silicon. Alternatively, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. The substrate 210 may include an epitaxial layer. For example, the substrate may have an epitaxial layer overlying a bulk semiconductor. Furthermore, the substrate 210 may include a semiconductor-on-insulator (SOI) structure. For examples, the substrate may include a buried oxide (BOX) layer formed by a process such as separation by implanted oxygen (SIMOX). The substrate 210 may include various p-type doped regions and/or an n-type doped regions, implemented by a process such as ion implantation and/or diffusion. These doped regions in the substrate 210 may provide various functional devices or features such as metal-oxide-silicon (MOS) transistor, an imaging sensor, and combinations thereof. The substrate 210 may include lateral isolation features disposed to separate various devices formed on the substrate 210. The substrate 210 may further at least partially include a plurality of patterned dielectric layers and patterned conductive layers combined to form interconnections configured to couple the various p-type and n-type doped regions and the other functional features. For example, the substrate 210 may include a portion of a multi-layer interconnect (MLI) structure and an inter-level dielectric (ILD) disposed in the MLI structure.

In one embodiment, the substrate 210 may additionally include various dummy features to improve chemical mechanical polishing (CMP) processing performance, global substrate surface flatness, and wafer bonding quality. The various dummy features may include a dummy gate, a dummy isolation feature, a dummy metal line, a dummy metal plug, and/or a dummy device such as a dummy transistor. The various dummy features may be disposed in various open areas in the substrate 210. For example, a dummy feature may be disposed in a device region such as in an IC die to unify pattern density. A dummy feature may be alternatively or additionally disposed in a scribe-line area and/or a frame area, and may be further incorporated with a test pattern, a monitor pattern, an online measurement pattern, and/or a wafer level reliability (WLR) test pattern for pattern density uniformity. A dummy metal pattern may be disposed in various metal layers and have proper dimension for other fabrication and performance consideration including mechanical stress and electrical coupling. The various dummy features are formed simultaneously with associated IC features. For example, a dummy metal feature may be formed with functional interconnect features.

At step 102, a top conductive layer is formed on the substrate 210 and patterned to have a plurality of top conductive features 220. For example, the top conductive features include large size isolated feature 220a, small size isolated features 220b, large size dense features 220c, 220d and 220e. The top conductive features 220 may comprise aluminum, aluminum/silicon/copper alloy, titanium, titanium nitride, tungsten, or combinations as used in conventional metal process or copper damascene process technology nodes. The top conductive layer may have a thickness ranging from about 5K angstrom to about 15K angstrom. In one example, the top conductive layer has a thickness about 8K angstrom. The top conductive layer may be deposited by sputtering, chemical vapor deposition (CVD), or combinations thereof. Other manufacturing processes, including photolithography and etching, may be used to pattern the conductive materials to form the plurality of top conductive features 220. The top conductive features may alternatively or additionally include other proper materials disposed and patterned on the substrate 210.

In one embodiment, one or more dummy conductive features are formed on the substrate 210 along with the formation of the top conductive features. The dummy conductive features may be disposed in various open areas in the substrate 210 for pattern density uniformity. For example, the dummy conductive features may be disposed in device regions. The dummy conductive features may be alternatively or additionally disposed in a scribe-line area and/or a frame area, and may be further incorporated with a test pattern, a monitor pattern, an online measurement pattern, and/or a WLR test pattern. The dummy conductive features are formed with the top conductive features. Thus formed top dummy conductive features are capable to improve chemical mechanical polishing (CMP) processing performance, substrate surface flatness, and wafer bonding quality when the wafer 205 is bonded to another wafer.

Figure 3:
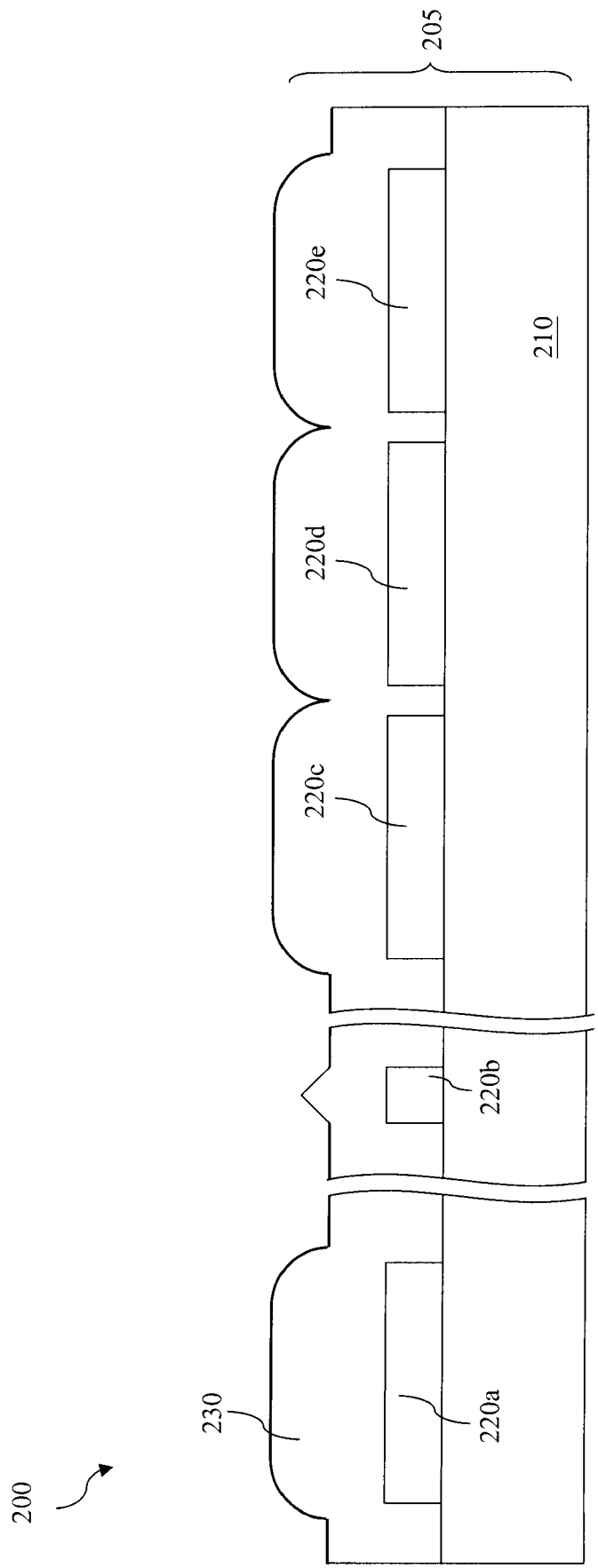

Referring to FIGS. 1 and 3, the method 100 proceeds to step 104 in which a dielectric layer 230 is formed over the patterned top conductive features and the top dummy conductive features 225 if any. The formed dielectric layer has a profile at least partially conformal to the profile of the patterned top conductive layer, resulting a bumpy surface. For example, the dielectric layer 230 may include dip regions within the openings of the patterned top conductive layer and form ridge regions overlying the top conductive features and/or the dummy conductive feature.

In one embodiment, the dielectric layer 230 includes silicon oxide. Alternatively, the dielectric layer 230 may include silicon nitride, silicon oxynitride, a low dielectric constant (low k) material, a combination thereof, or a combination with silicon oxide. The low k material may include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other materials as examples. The dielectric layer 230 may have a thickness ranging between about 10K angstrom and about 30K angstrom to fully fill the openings of the patterned top conductive layer and reach above the patterned top conductive features. In one example, the dielectric layer has a thickness about 16K angstrom.

A process of forming the dielectric layer 230 may utilize a chemical vapor deposition (CVD) or a spin-on coating process. In one embodiment, a high density plasma chemical vapor deposition (HDPCVD) is implemented to form the silicon oxide dielectric layer.

Figure 4:
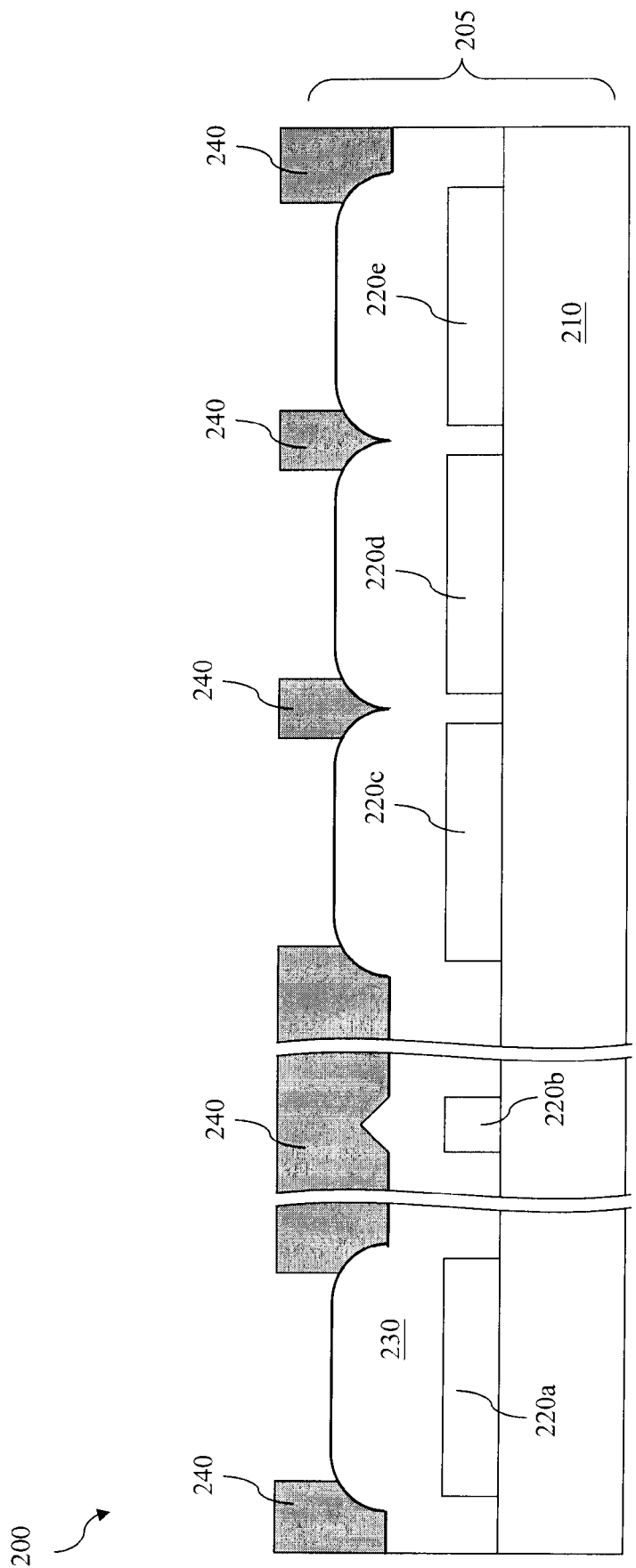

Referring to FIGS. 1 and 4, at step 106 of the method 100, a photoresist layer 240 is applied and patterned on the dielectric layer 230 such that the openings of the patterned photoresist layer 240 substantially expose the dielectric layer 230 in a target region aligned to the plurality of top conductive features. In another embodiment, the patterned photoresist layer 240 is formed with openings exposing the dielectric layer 230 in a target region substantially aligns to the plurality of top conductive features and the top dummy conductive feature. In one example, the photoresist layer may be applied on the dielectric layer 230 by a spin-on coating and patterned by a lithography process including exposing thereof to a radiation beam. The radiation beam may be a photon beam. For example, the resist layer on a semiconductor wafer may be exposed to an ultraviolet (UV) light through a mask having a predefined pattern. The exposing process may be implemented using a stepper by a step-and-repeat method or using a scanner by a step-and-scan method. An exemplary photolithography process to form a patterned photoresist layer may include processing steps of photoresist coating, soft baking, mask aligning, exposing pattern, post-exposure baking, developing photoresist, and hard baking. The photolithography process may be implemented or replaced by other proper methods such as maskless photolithography, electron-beam writing, ion-beam writing, and molecular imprint.

Figure 5:
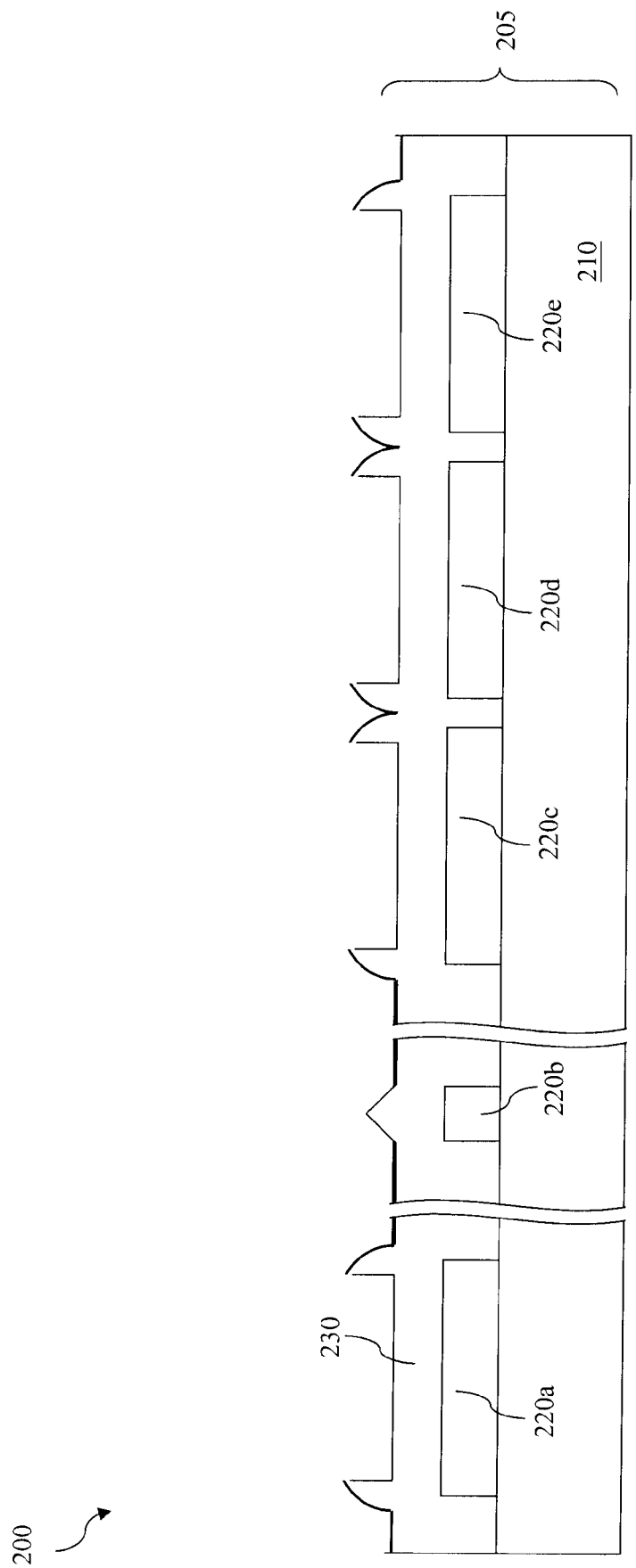

Referring to FIGS. 1 and 5, at step 108 of the method 100, the dielectric layer 230 exposed within the openings of the patterned photoresist layer 240 is etched such that the dielectric layer within the target region is substantially recessed level with the dielectric layer in the dip regions. For example, with the top conductive layer of about 8K angstrom thickness and the dielectric layer of about 16K angstrom thickness, the etching process may substantially reduce the dielectric layer within the target region of about 9K angstrom. The etching process may include a wet etching and/or a dry etching. Wet etching may be an isotropic etching method. For example, a buffered hydrofluoric acid (BHF) solution may be used to etch the dielectric layer 230 made of silicon dioxide. In addition or in the alternative, a dry etching process can be carried out in a gas-phase, with a chemical etching effect, a physical ion milling, and/or combinations thereof. In various embodiments, a plasma dry etching may utilize a partially ionized gas including F, Cl, O, H, and/or $CF_3$ radicals. The patterned photoresist layer 240 may be wet striped or ashed thereafter. Since the dielectric layer 230 is selectively etched through a photoresist pattern being reversed from the pattern of the underlying top conductive features (220a, 220b, 220c and 220d) and the dummy conductive feature, the bumpy profile of the dielectric layer 230 is substantially reduced, a polishing process described below is therefore enhanced. The substrate surface is therefore improved for wafer bonding with better adhesion and effectiveness. An additional dielectric layer (not shown) such as a layer of the same material to the dielectric layer 230 may be further formed on the dielectric layer 230 thereafter. In one example, an additional silicon oxide layer may be applied on the dielectric layer 230 by a method similar to the method of forming the dielectric layer 230.

Figure 6:
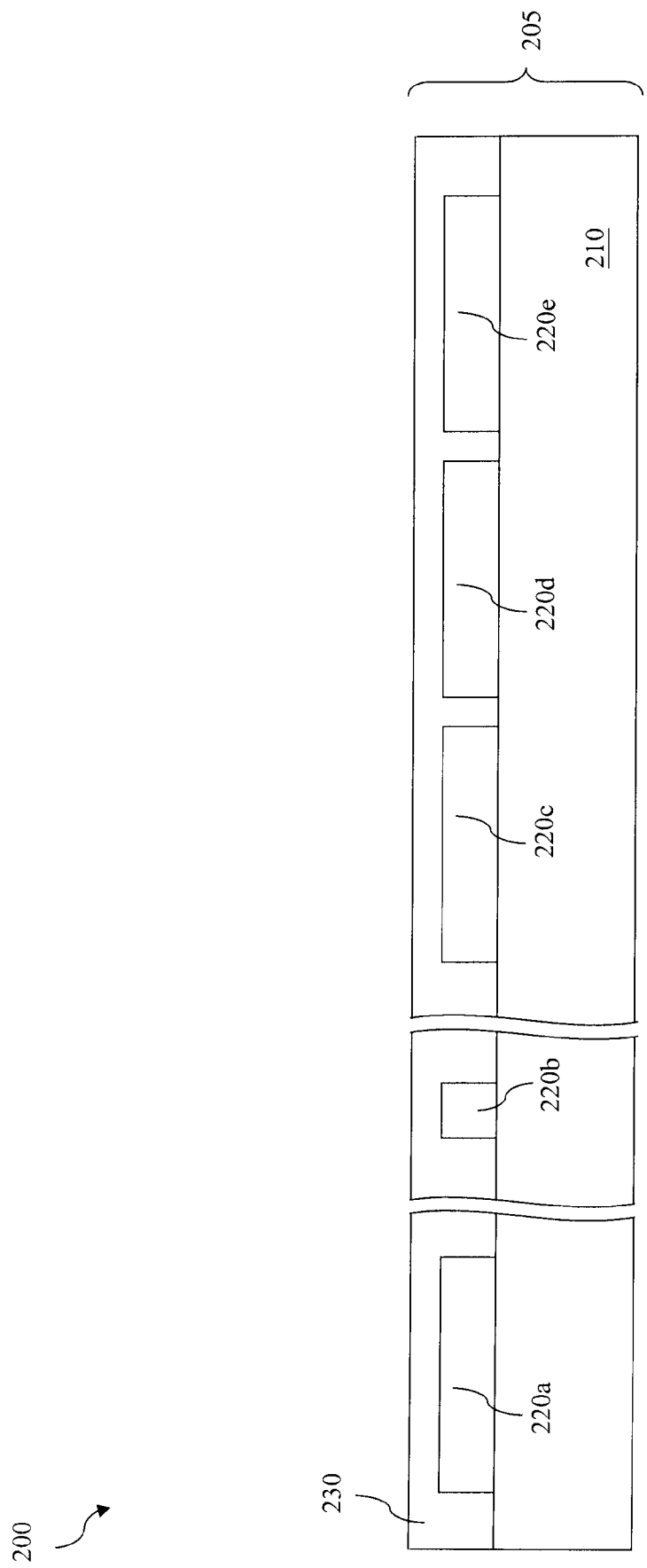

Referring to FIGS. 1 and 6, at step 110 of the method 100, a polishing process such as a chemical mechanical polishing (CMP) process is applied on the dielectric layer 230 to polish and further reduce the thickness thereof. For example, with the top conductive layer of about 8K angstrom thickness and the dielectric layer of about 16K angstrom thickness, the CMP process may substantially further reduce the dielectric layer 230 within the target region of about 2K~2.5K angstrom.

As an example, the CMP process is performed by mounting the substrate wafer face down on a carrier. The carrier is then pressed against a moving platen containing a polishing pad. The carrier itself is rotated. An abrasive-containing aqueous slurry is dripped onto the table, and centrifugal force distributes the slurry across the pad. The combination of mechanical effects and chemical reactions results in material removal from the surface of the substrate. Some other process such as an etching-back process may be alternatively or collectively utilized to achieve polishing and removal effect.

Figure 7:
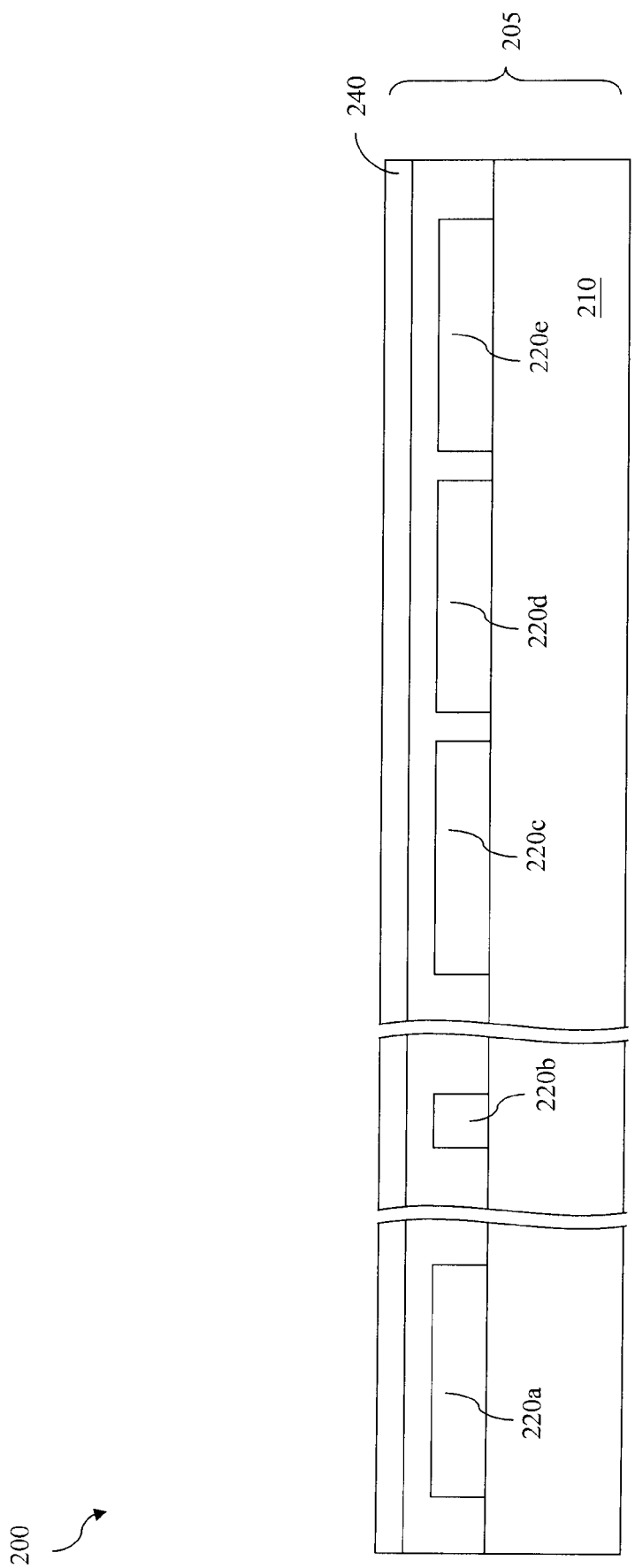

Referring to FIGS. 1 and 7, at step 112 of the method 100, a supplemental layer 240 may be formed on the dielectric layer 230. The supplemental layer 240 also includes dielectric material and may have a thickness ranging from about 1K to about 5K angstrom. For example, the supplemental layer has a thickness about 2K angstrom. In one embodiment, a silicon nitride is used to form the supplemental layer 240 by a proper method such as CVD. In furtherance of the embodiment, a plasma enhanced chemical mechanical deposition (PECVD) is implemented to form the supplemental silicon nitride layer. A second CMP process may be performed on the supplemental layer 240 for further polishing and improving the flatness of the wafer 205.

Figure 8:
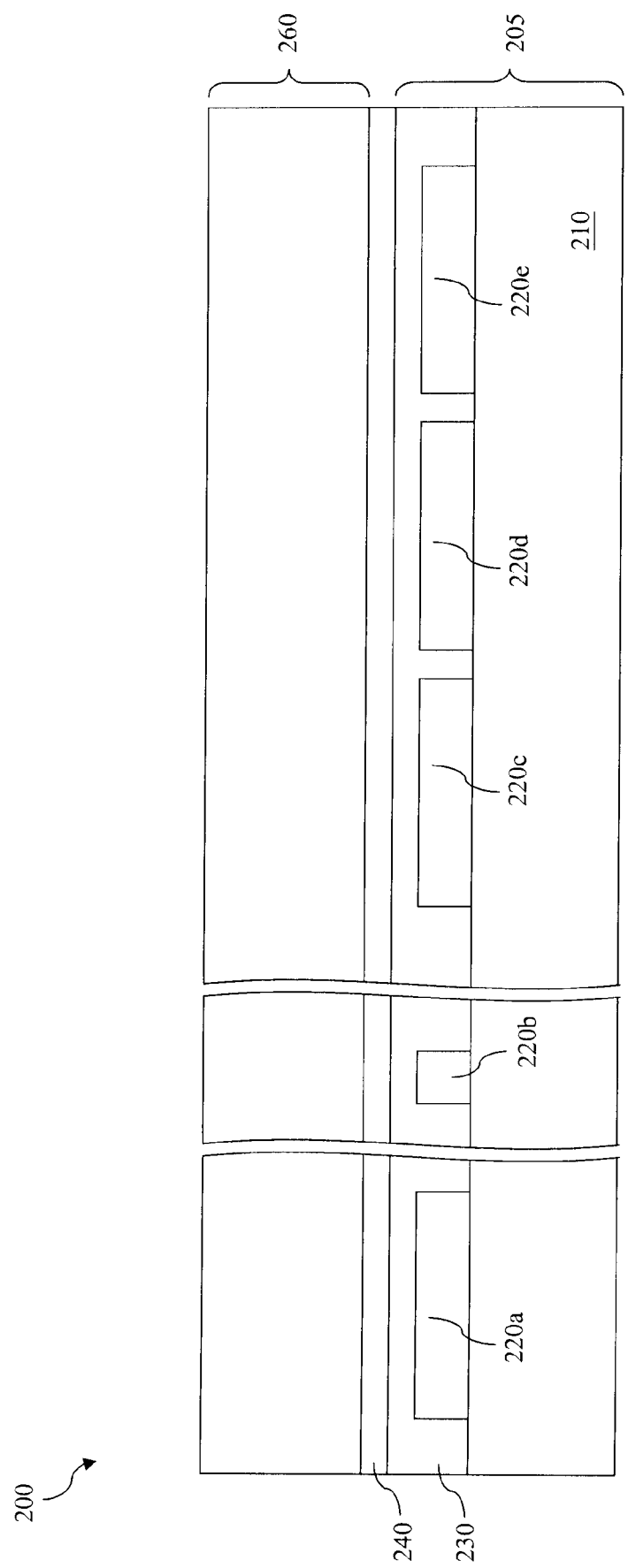

Referring to FIGS. 1 and 8, at step 114 of the method 100, a second substrate 260 is bonded to the first wafer 205 using the front surface (polished side) of the first wafer by molecular force. For example, the first wafer is brought to contact the second wafer. The two wafers are locally attracted to each other by Van der Waal forces and bonded together. The quality of wafer bonding depends on how closely the two surfaces contact each other locally and therefore depends on the flatness of the wafers. Since the first wafer includes various devices, patterned features, and multilayer interconnect features, especially top metal features, this results in a bumpy surface, reduces fully contact between the two wafers locally, and leads to air bubbles and/or de-lamination issues. The provided method efficiently improves wafer flatness and enhances wafer bonding quality.

In one embodiment, the second wafer 260 might be a carrier wafer to mechanically support and protect the first wafer. For example, if the first wafer include backside illuminated imaging devices, the carrier wafer is bonded to the front surface of the first wafer fabricated accordingly. The first wafer 205 is then grinded to reduce the thickness from the backside under the support of the carrier wafer. Color filters, micro-lens and other proper imaging features may be formed on the backside of the first wafer 205.

In another embodiment, the second wafer 260 is designed to form micro-electro-mechanical system (MEMS) devices. For example, the second wafer is designed to form a plurality of micro mirrors for various applications including display, optical switch, and mask-less exposure. The second wafer is bonded to the front surface of the first wafer. The second wafer is then grinded from the free surface after the wafer bonding. Other processes followed may include aluminum deposition onto the free surface of the second wafer, and etching the second wafer to form the plurality of micro mirrors. The first wafer may include various MOS transistor and integrated circuit formed thereby to drive and control the plurality of micro mirrors. In another embodiment, the second wafer may include a plurality of biosensors. The first wafer includes MOS transistors and a driver circuit for controlling measurement and collecting data.

Figure 9:
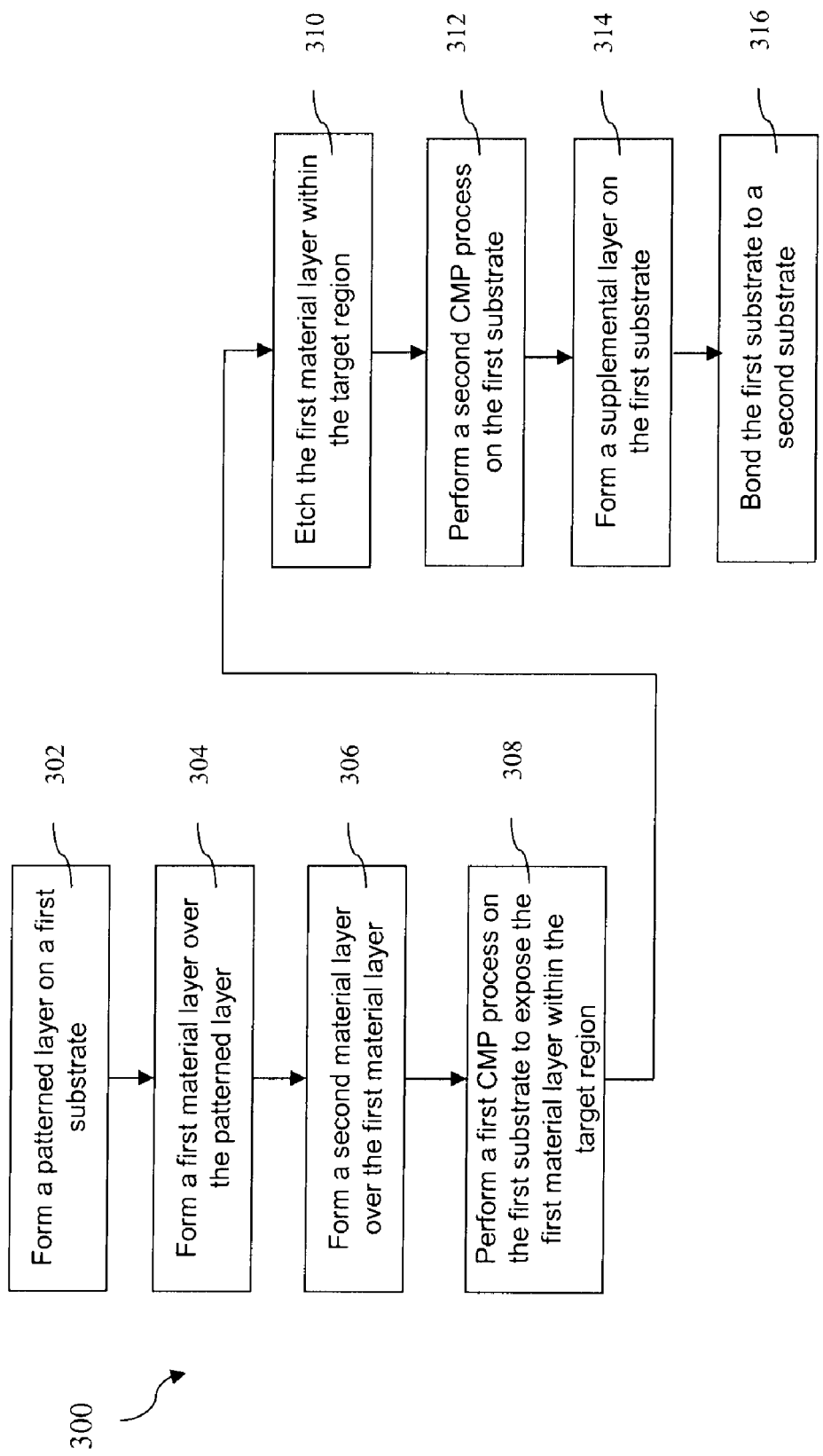
FIG. 9 is a flowchart of another embodiment of a method to form an integrated circuit.

As an alternative to the method 100 provided above, the first wafer can be fabricated utilizing a self-aligned reverse tone etching method illustrated below. FIG. 9 is a flowchart of one embodiment of a method 300 to form an integrated circuit. FIGS. 10 through 17 illustrate sectional side views of an exemplary integrated circuit 400 during various fabrication stages and made by the method 300. With reference to FIGS. 10 through 17, the method 300 and the exemplary integrated circuit 400 are collectively described below.

Figure 10:
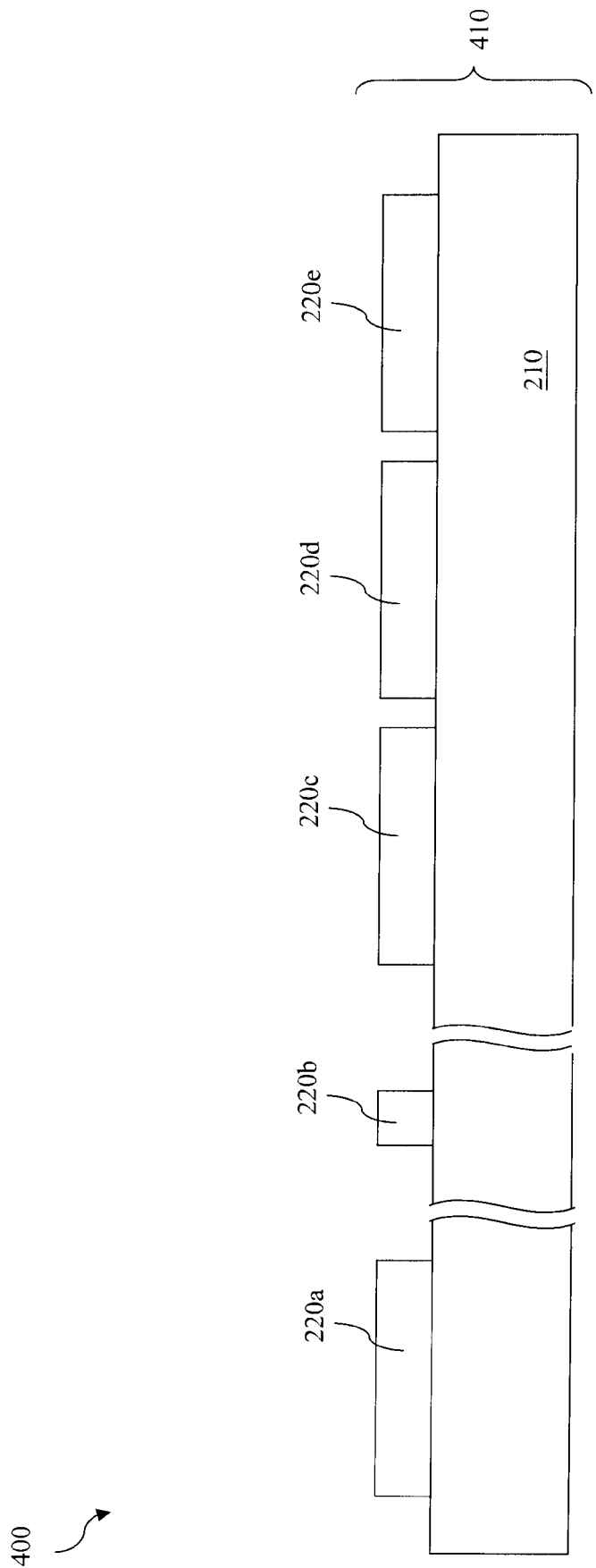
FIGS. 10 through 17 illustrate sectional side views of another exemplary integrated circuit during various fabrication stages, made by the method of FIG. 9.

Referring to FIGS. 9 and 10, the method 300 begins at step 302 by providing a first wafer 410 having a first substrate 210. The substrate 210 includes silicon or alternatively other semiconductor material, substantially similar to the substrate 210 of the integrated circuit 100 illustrated in FIG. 2. Similarly, the substrate 210 may include an epitaxial layer, a SOI structure, various isolation features, and/or various p-type doped regions and/or an n-type doped regions. These doped regions in the substrate 210 may provide various functional devices or features such as metal-oxide-silicon (MOS) transistor, an imaging sensor, and combinations thereof. The substrate 210 may further include a plurality of patterned dielectric layers and patterned conductive layers combined to form interconnections configured to couple the various p-type and n-type doped regions and the other functional features. In one example, the substrate 210 may include at least a portion of a MLI structure and an ILD disposed in the MLI structure.

In one embodiment, the substrate 210 may additionally include various dummy features to improve chemical mechanical polishing (CMP) performance, global substrate surface flatness, and wafer bonding quality. The various dummy features may include a dummy gate, a dummy isolation feature, a dummy metal line, a dummy metal plug, and/or a dummy device such as a dummy transistor. Similarly, the various dummy features may be disposed in various open areas in the substrate 210. For example, a dummy feature is disposed in a device region, and/or disposed in a scribe-line area and/or a frame area, and may be further incorporated with various test, measurement and monitor patterns for pattern density uniformity. A dummy metal pattern may be disposed in various metal layers and have proper dimension for other fabrication and performance consideration, including mechanical stress and electrical coupling. The various dummy features are formed simultaneously with relevant IC features. For example, a dummy metal feature may be formed with functional interconnect features.

At step 302, a top conductive layer is formed on the substrate 210 and patterned to have a plurality of top conductive features 200. In one example, the top conductive features include a large size isolated feature 220a, a small size isolated features 220b, and large size isolated features 220c, 220e and 220d. For example, the top conductive features 220 may comprise aluminum, aluminum/silicon/copper alloy, titanium, titanium nitride, tungsten, or combinations. The top conductive layer may be deposited by sputtering, chemical vapor deposition (CVD), or combinations thereof. The top features 220 may alternatively or collectively include other proper materials disposed and patterned on the substrate 210.

In one embodiment, various top dummy conductive features are formed on the substrate 210 along with the top conductive features 220. The dummy conductive features may be disposed in various open areas in the substrate 210 for pattern density uniformity, including device regions, scribe-line areas, and frame areas, and may be further incorporated with various test, measurement, and monitor patterns.

Figure 11:
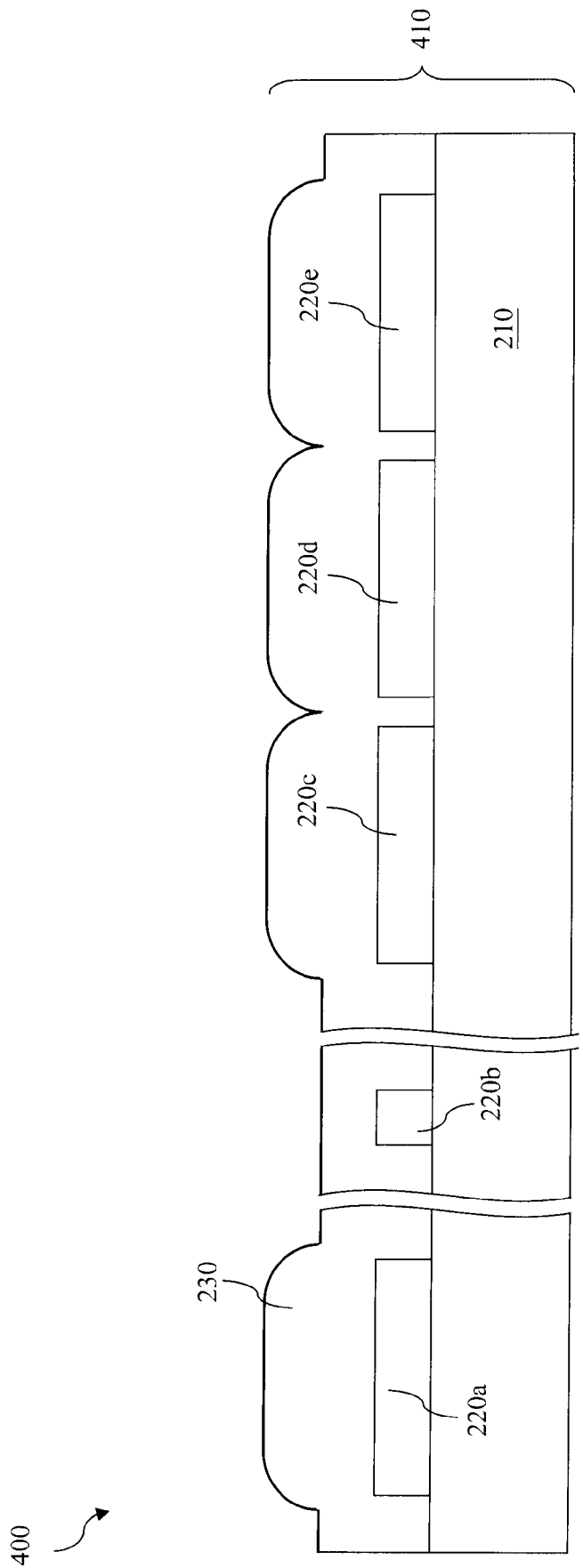

Referring to FIGS. 9 and 11, the method 300 proceeds to step 304 and a first dielectric layer 230 is formed over the patterned top conductive features 220. In one embodiment, the dielectric layer 230 includes silicon oxide. Alternatively, the dielectric layer 230 may include other suitable materials such as silicon nitride, silicon oxynitride, a low dielectric constant (low k) material, a combination thereof, or a combination with silicon oxide. A process of forming the dielectric layer 230 may utilize CVD or a spin-on coating. In one embodiment, a HDPCVD process is implemented to form the silicon oxide dielectric layer. The dielectric layer 230 may have a thickness ranging between about 10K angstrom and about 30K angstrom. In one example, the dielectric layer has a thickness about 16K angstrom. The dielectric layer has a profile substantially conformal to the profile of the patterned top conductive layer, resulting a bumpy surface.

Figure 12:
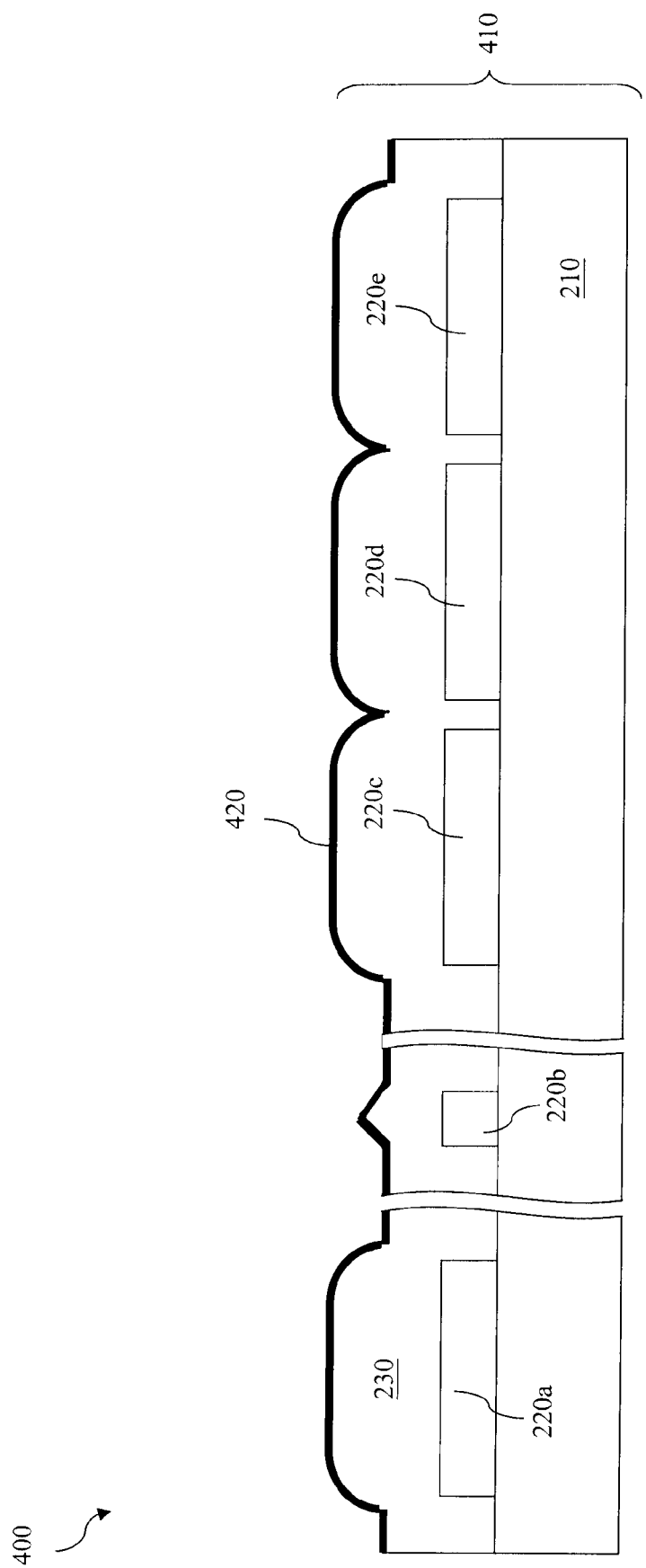

Referring to FIGS. 9 and 12, at step 306 of the method 300, a second dielectric layer 420 is formed on the first dielectric layer 230 wherein the second dielectric layer 420 is different from the first dielectric layer 230. For example, if the first dielectric layer 230 uses silicon oxide, the second dielectric layer 420 may use silicon nitride. The second dielectric layer 420 may have a thickness ranging from about 0.5K angstrom to about 5K angstrom. In one example, with the top conductive layer of about 8K angstrom thickness and the dielectric layer of about 16K angstrom thickness, the second dielectric layer has a thickness about 1K angstrom. The second dielectric layer 420 is substantially conformal to the first dielectric layer 230, with ridge regions over the top conductive features 220, and with dip regions within the openings of the patterned conductive layer.

Figure 13:
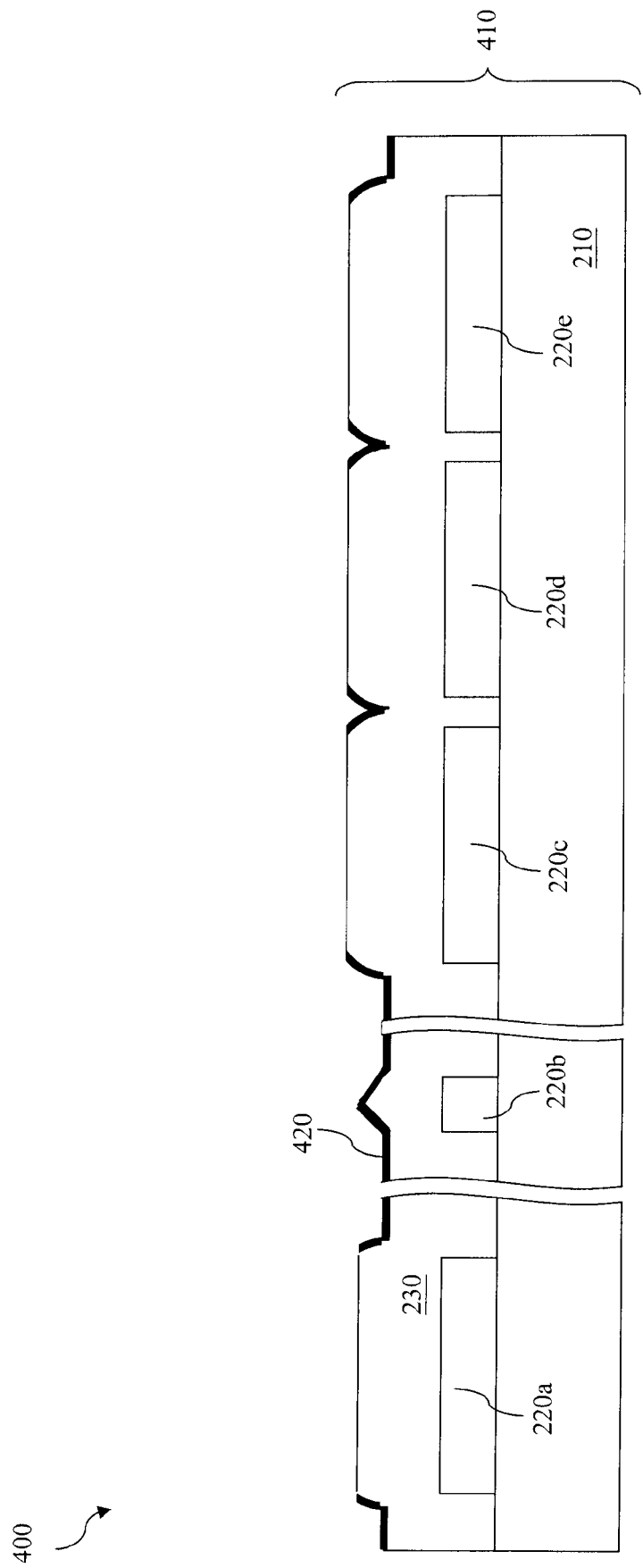

Referring to FIGS. 10 and 13, at step 308 of the method 300, a polishing process such as a CMP process is applied on the second dielectric layer 420 to polish and reduce the thickness of the dielectric layer 230. Since the second dielectric layer 420 is conformal to the first dielectric layer, having the dip regions and ridge regions, the CMP process is capable of selectively removing the second dielectric layer within the ridge regions. The CMP process is implemented such that the second dielectric layer in the ridges regions are completely removed, exposing the underlying first dielectric layer thereby. The second dielectric layer within the dip regions may only be partially removed, still covering the underlying first dielectric layer within the dip regions. In one embodiment, with the second dielectric layer of about 1K angstrom thickness, the CMP process may reduce the first and second dielectric layers collectively about 2K~3K angstrom. A proper adjustment of mechanical effects and chemical reactions may enhance the selective removal effect between the ridge regions and dip regions through tuning CMP parameters such as slurry type, polishing pressure, polishing pad hardness, and polishing speed. After the CMP process, a self-aligned pattern of the second dielectric layer is formed, with openings exposing the first dielectric layer within a target region substantially overlying the top conductive features 220 including dummy conductive features if any.

Figure 14:
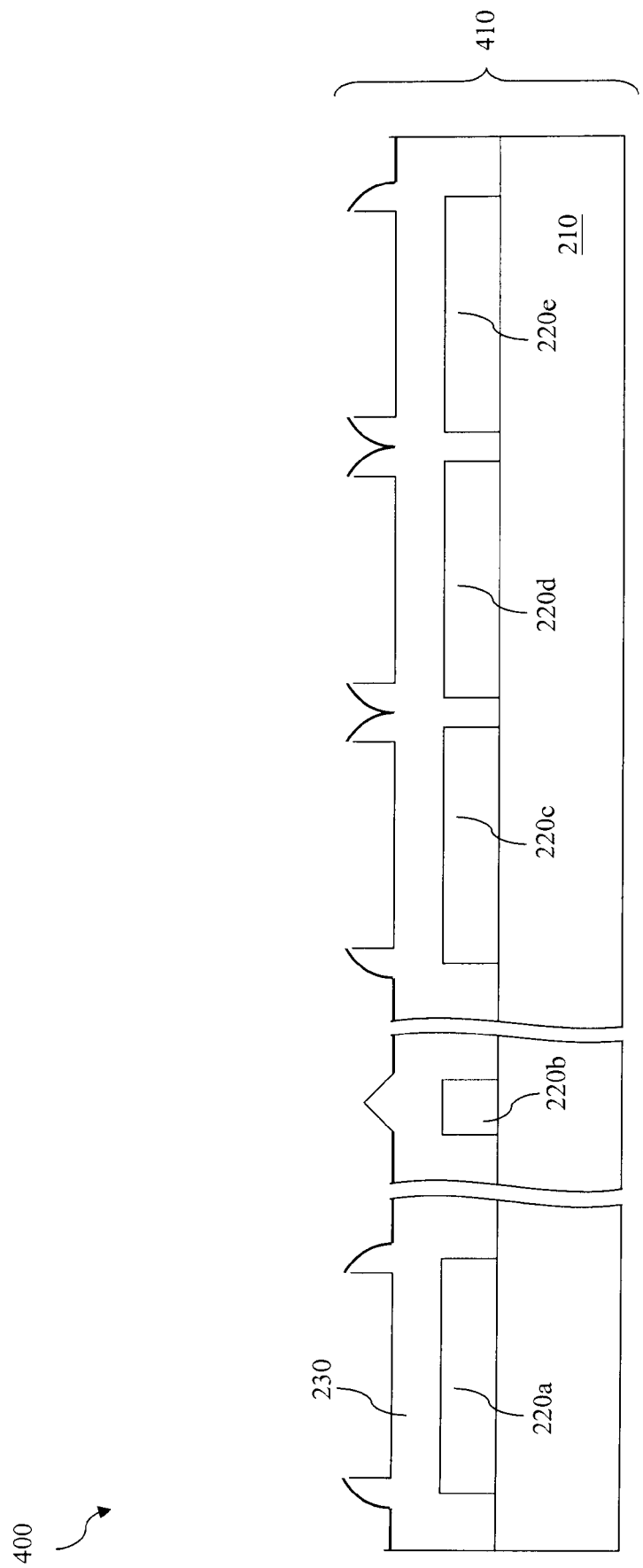

Referring to FIGS. 9 and 14, at step 310 of the method 300, the first dielectric layer 230 exposed within the openings of the second dielectric layer 420 is etched such that the first dielectric layer within the ridge region is substantially recessed onto a level with the first dielectric layer in the dip regions. In one embodiment, the etching process may reduce the thickness of the first dielectric layer of about 8K~9K angstrom. The etching process may include a wet etching and/or a dry etching with a proper etching selectivity between the first and second dielectric layers. In one embodiment, a buffered hydrofluoric acid (BHF) may be used to etch the first dielectric layer 230 made of silicon dioxide. The second dielectric layer 420 may be partially consumed after the completion of the etching process and may be removed thereafter by another etching process. For example, the second dielectric layer of silicon nitride may be selectively removed by a hot phosphoric acid solution. Alternatively, the second dielectric layer can be removed in a following CMP process at step 312. An additional dielectric layer may be formed on the first dielectric layer 230 after the removal of the second dielectric layer. In one example, another silicon oxide layer is formed by a method similar to the method of forming the first dielectric layer 230.

As the first dielectric layer 230 is selectively etched using the self-aligned pattern of the second dielectric layer as a mask, the bumpy profile of the first dielectric layer 230 is substantially reduced. The substrate surface is improved for wafer bonding with better adhesion and effectiveness.

Figure 15:
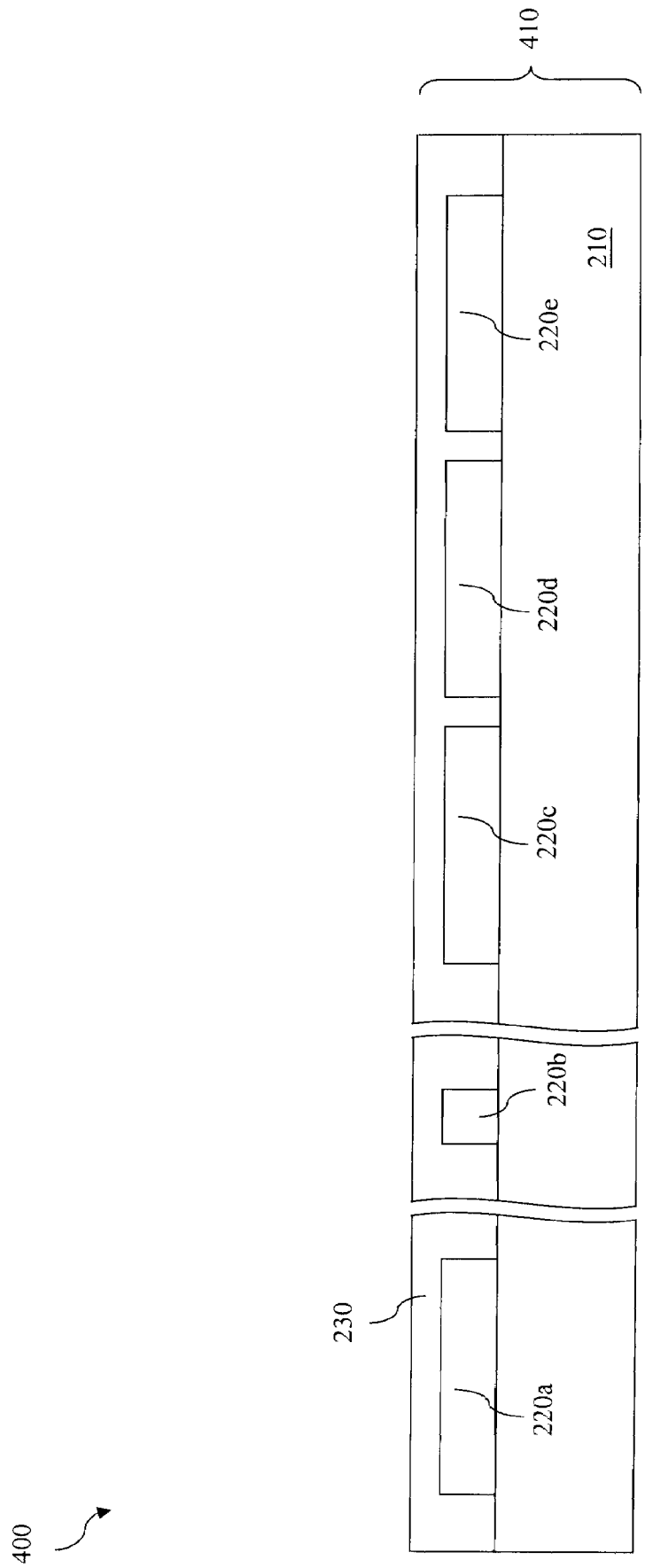

Referring to FIGS. 9 and 15, at step 312 of the method 300, a second polishing process such as a CMP process is applied on the first dielectric layer 230 to polish and further reduce the thickness thereof. The second dielectric layer may also be removed at this step if not removed at step 310. In one example, the second CMP process may reduce the thickness of the first dielectric layer about 2K~2.5K angstrom. The second CMP process may be substantially similar to the CMP process of the method 100 at step 110.

Figure 16:
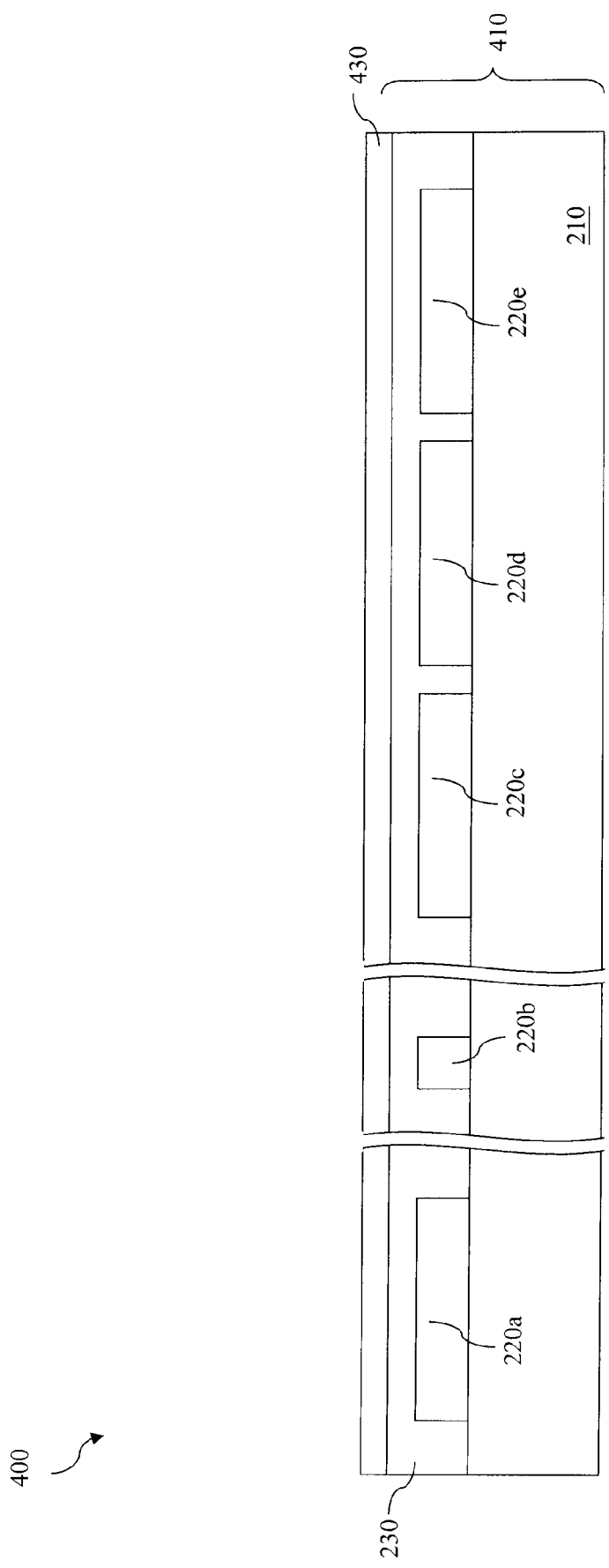

Referring to FIGS. 9 and 16, at step 314 of the method 300, a supplemental layer 430 may be formed on the dielectric layer 230. The supplemental layer 430 may also include a dielectric material. In one embodiment, a silicon nitride is used to form the supplemental layer 430 by a proper method such as CVD. In furtherance of the embodiment, a PECVD is implemented to form the supplemental silicon nitride layer. Alternatively, a third CMP process may be applied on the supplemental layer 430 to further improve flatness of the wafer 410.

Figure 17:
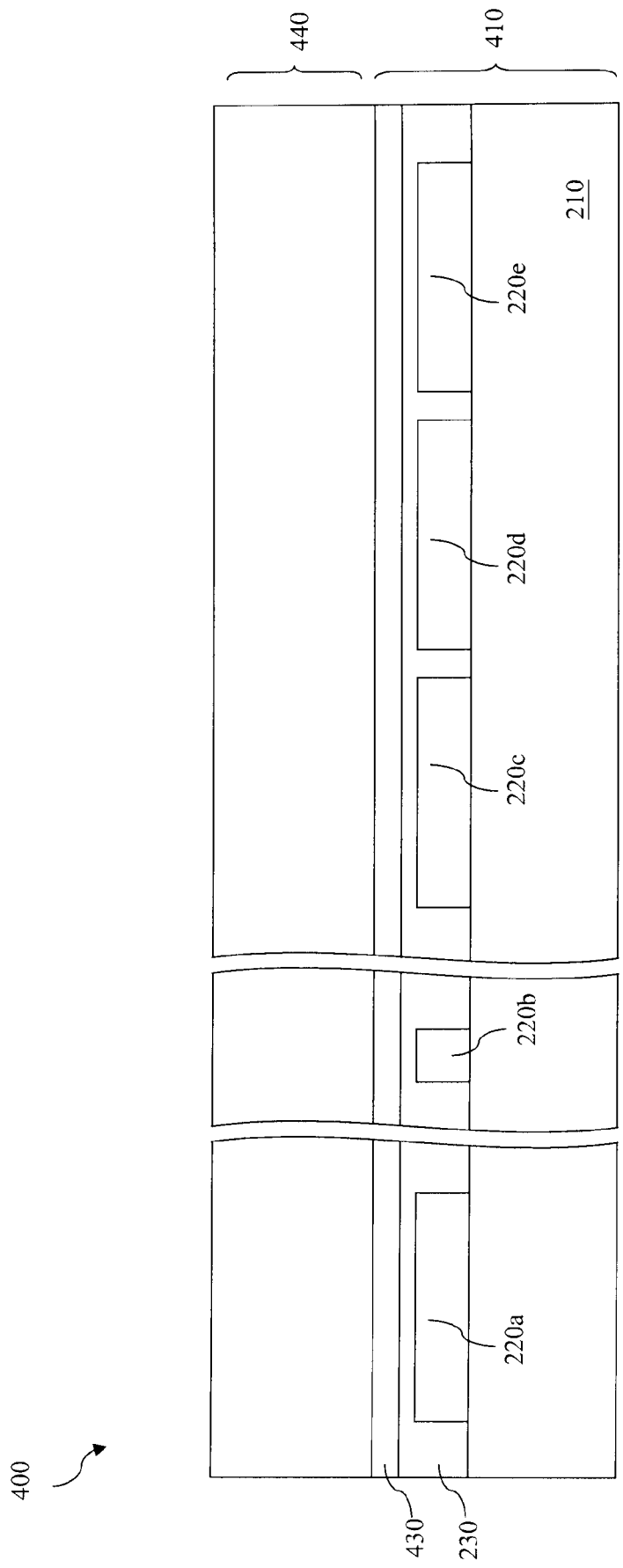

Referring to FIGS. 9 and 17, at step 316 of the method 300, a second wafer 440 is bonded to the first wafer 410 using the polished side of the first wafer substantially similar to the wafer bonding of the method 100 at step 114. The disclosed method improves wafer flatness and enhances wafer bonding quality. The second wafer 440 may be substantially similar to the second wafer 260 used in the method 100 at step 114. For example, the second wafer 440 might be a carrier wafer to mechanically support and protect the first wafer after the wafer bonding. In another embodiment, the second wafer 440 might be used to form micro-electro-mechanical system (MEMS) devices or a plurality of biosensors.

Figure 18:
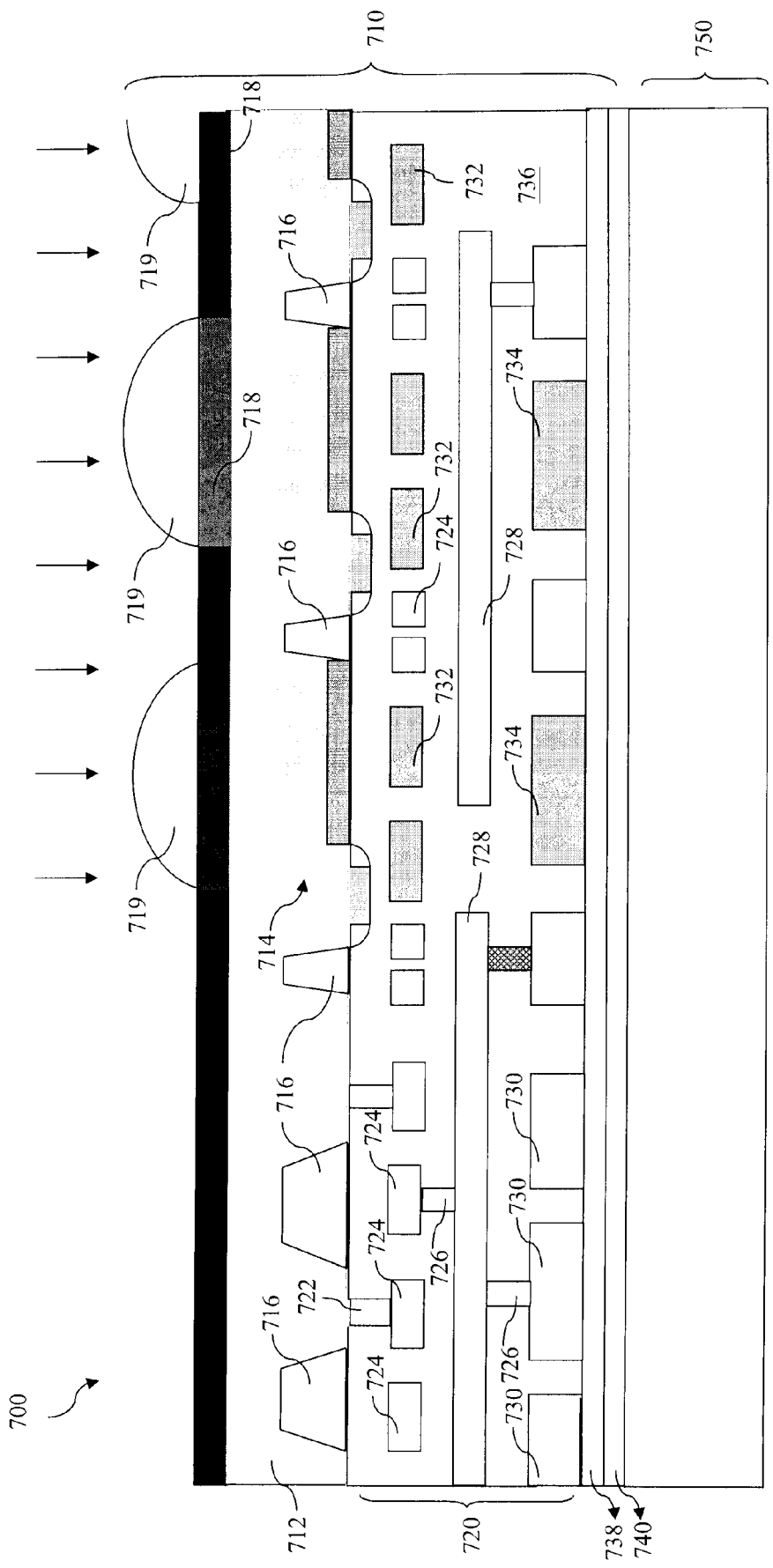
FIG. 18 illustrates a sectional side view of one embodiment of an integrated circuit constructed according to aspects of the current disclosure.

FIG. 18 illustrates an integrated circuit 700 in one embodiment, utilizing the method 100 illustrated in FIG. 1 or the method 300 illustrated in FIG. 9. The integrated circuit 700 include a first chip 710 having a first substrate 712 and a plurality of imaging devices 714 formed therein. The first chip 710 further includes various isolation features 716 formed in the first substrate to isolate the various imaging devices 714 and other devices formed in the first substrate 712. The first chip 710 may further include various color filters 718 and micro lens 719 disposed on the backside of the first substrate 712, configured for the plurality of imaging devices 714, respectively. The first chip also includes a multilayer interconnect (MLI) structure 720 formed on the front side of the first substrate 712, configured to couple the plurality of imaging devices, power, and signals, and isolated by interlayer dielectric (ILD) materials 736 formed between the MLI structure 720. The MLI structure 720 further includes contacts 722, first layer metal lines 724, vias 726, metal lines 728, and the top metal lines 730 properly configured and connected. The MLI structure 720 additionally include various dummy features including dummy metal features 732 and top dummy metal features 734 disposed therein to unify metal density and enhance CMP polishing effect thereby. The first chip 710 includes the dielectric layer formed within and over the top metal lines 730 and the top dummy metal features 734 with enhanced flat surface utilizing the method 100 or the method 300. The first chip may further include a supplemental layer 740 used for passivation and/or other functions. The integrated circuit 700 includes a second chip 750 bonded to the front surface of the first chip 710 to mechanically support and protect the first chip. The dimensions, materials and configurations of the integrated circuit 700 may be modified without departure of the scope and spirit of the disclosure. The integrated circuit 700 is illustrated only as an example of various microelectronic devices formed by the disclosed methods.

Figure 19:
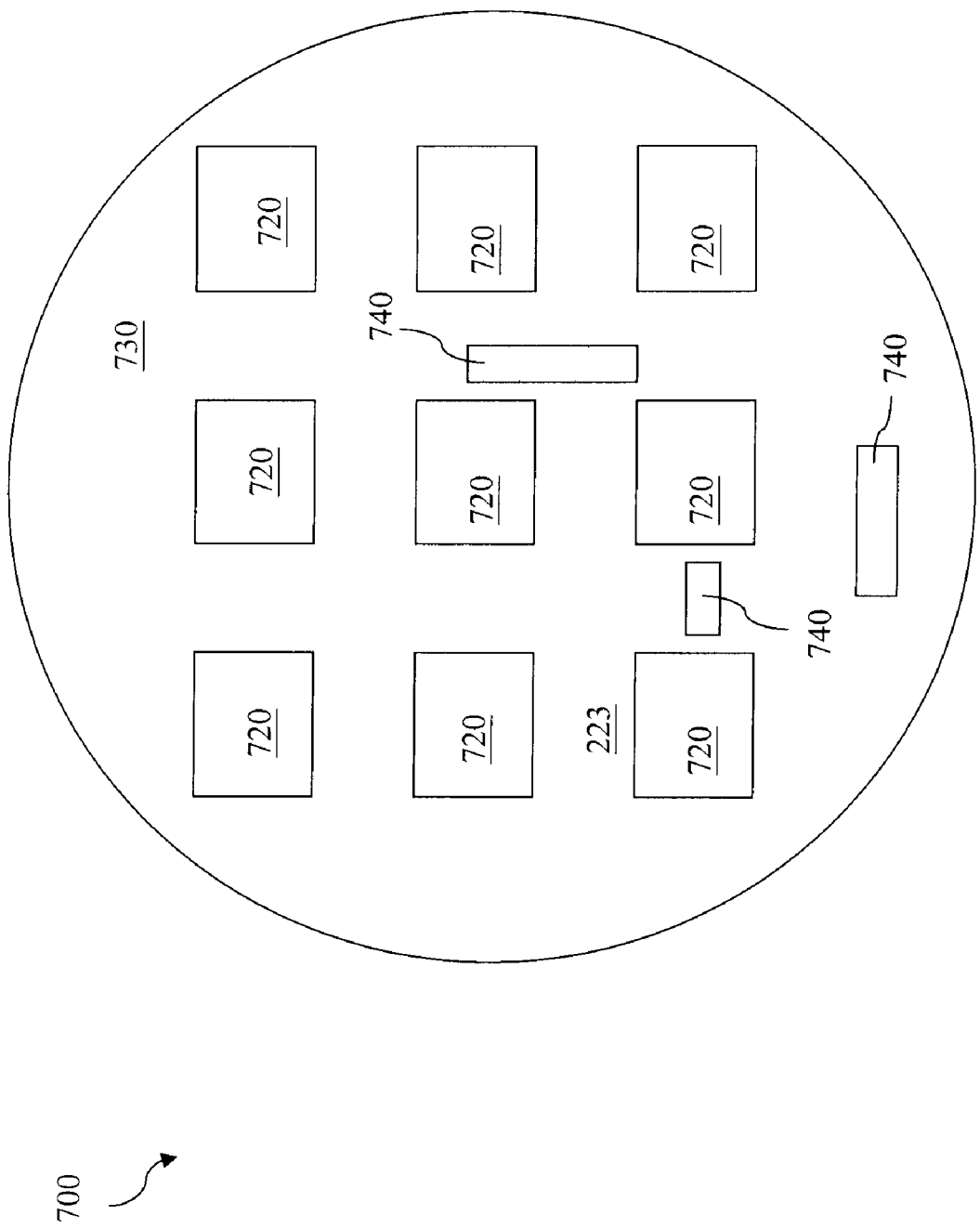
FIG. 19 illustrates a top view of one embodiment of an integrated circuit with various dummy features constructed according to aspects of the current disclosure.

FIG. 19 illustrates a top view of one embodiment of an integrated circuit 700 with various dummy features constructed according to aspects of the current disclosure. The integrated circuit 700 includes various device regions 720

(such as IC dies) incorporated with the plurality of top conductive features (not shown) therein and further include scribe-line or frame regions 730. Various dummy conductive feature 740 may be disposed in various open areas in the substrate 710 for pattern density uniformity. For example, the dummy conductive features 740 may be disposed in device regions 720. The dummy conductive features 740 may be alternatively or additionally disposed in a scribe-line and/or a frame regions, and may be further incorporated with a test pattern, a monitor pattern, an online measurement pattern, and/or a WLR test pattern. The dummy conductive feature 740 may be formed along with the formation of the top conductive features. Thus formed top dummy conductive features 740 are capable to improve chemical mechanical polishing (CMP) processing performance, substrate surface flatness, and wafer bonding quality when the integrated circuit 700 (such as a wafer) is bonded to another wafer.

Thus, the present disclosure provides a method of manufacturing a microelectronic device. The method includes forming a top metal layer on a first substrate, wherein the top metal layer includes a plurality of interconnect features and a first dummy feature; forming a first dielectric layer over the top metal layer; etching the first dielectric layer in a target region substantially vertically aligned to the plurality of interconnect features and the first dummy feature of the top metal layer; performing a chemical mechanical polishing (CMP) process over the first dielectric layer; and thereafter bonding the first substrate to a second substrate.

In the disclosed method, the first dummy feature may be disposed in an open region selected from the group consisting of a device region, a scribing-line region, a frame region, and combination thereof. The method may further include forming a second dummy feature disposed in the first substrate. The forming of the second dummy feature may include forming a structure selected from the group consisting of a dummy gate, a dummy metal feature, a dummy isolation, a dummy device, and combinations thereof. The method may further include forming a plurality of metal-oxide-silicon (MOS) transistors in the first substrate and forming the second substrate with a structure selected from the group consisting of a mechanical supporting structure, a micro-electro-mechanical system (MEMS) device, a biosensor, and combinations thereof. The method may further include forming a patterned photoresist layer over the first dielectric layer having a plurality of openings to expose the first dielectric layer in the target region prior to the etching of the first dielectric layer in the target region. The method may further include forming a second dielectric layer overlying the first dielectric layer, wherein the second dielectric layer is different from the first dielectric layer; and performing a preliminary CMP process on the second dielectric layer, thereby removing the second dielectric layer within the target region and exposing the first dielectric layer within the target region.

The present disclosure also provides another embodiment of a method for manufacturing a microelectronic device. The method includes forming a first patterned layer on a first substrate, wherein the first patterned layer has a plurality of features; forming a first material layer on the first patterned layer; etching the first material layer in a target region substantially vertically aligned over the plurality of features of the first patterned layer; performing a chemical mechanical polishing (CMP) process on the first material layer; and thereafter bonding the first substrate to a second substrate.

The method may further include forming a mask over the first material layer to expose the first material layer in the target region before the etching of the first material layer. The forming of the mask includes forming a patterned photoresist layer on the first material layer, the patterned photoresist layer having a plurality of openings exposing the first material layer within the target region.

Alternatively, the forming of the mask may include forming a second material layer on and conformal to the first material layer, the second material layer being different form the first material layer; and performing a preliminary CMP process on the second material layer, thereby removing the second material layer within the target region and exposing the first material layer within the target region. The forming of the second material layer includes forming a silicon nitride layer by plasma enhanced chemical vapor deposition (PECVD). The second material layer may include a thickness of about 1K angstrom. The performing of the preliminary CMP may include reducing the second material and first material layers by a thickness ranging between about 2K and 3K angstrom.

In the method, the first material layer may include silicon oxide formed by high density plasma chemical vapor deposition (HDPCVD). The plurality of features may include top metal features. The method may further include forming a supplemental layer on the first substrate after the performing of the CMP process and before the bonding. The supplemental layer may include a material selected from the group consisting of silicon nitride, silicon oxide, silicon oxynitride, and combinations thereof. The method may further include utilizing an additional CMP process to the supplemental layer. The method may further include forming a supplemental layer on the first substrate after the etching of the first material layer and before the performing of the CMP process.

The present disclosure also provides an embodiment of a microelectronic device manufactured by the disclosed method in various embodiments. The device includes a first substrate having a plurality of integrated circuit (IC) features; a plurality of top metal features and a dummy metal feature disposed on the first substrate; a dielectric layer disposed on the first substrate isolating the plurality of top metal features and the dummy metal feature; and a second substrate bonded to the first substrate. The dielectric layer is etched selectively and thereafter polished, thereby providing a substantially flat surface.

In the microelectronic device, the plurality of IC features may include a structure selected from the group consisting of an image sensor, a metal oxide semiconductor (MOS) transistor, and combinations thereof. The second substrate may include a structure selected from the group consisting of a micro-electro-mechanical system (MEMS) device, a device interconnect structure, a supporting structure, a biosensor, and combinations thereof. The dummy metal feature may be disposed in a region selected from the group consisting of a device region, a scribe-line region, and a frame region, and combination thereof. The device may further include an additional dummy feature incorporated on the first substrate, the additional dummy feature is selected from the group consisting of a dummy gate, a dummy metal feature, a dummy device, a dummy isolation feature, and combinations thereof. The dielectric layer may include a layer of silicon oxide polished utilizing a chemical mechanical polishing process; and a layer of silicon nitride disposed on the layer of silicon oxide.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for manufacturing a microelectronic device, comprising:
   forming a top metal layer on a first substrate, wherein the top metal layer includes a plurality of interconnect features and a first dummy feature;
   forming a first dielectric layer over the top metal layer;
   etching the first dielectric layer in a target region substantially vertically aligned to the plurality of interconnect features and the first dummy feature of the top metal layer;
   performing a chemical mechanical polishing (CMP) process over the etched first dielectric layer; and
   after performing the CMP process, bonding the first substrate to a second substrate.

2. The method of claim 1, wherein the first dummy feature is disposed an open region selected from the group consisting of a device region, a scribing-line region, a frame region, and combination thereof.

3. The method of claim 1, further comprising forming a second dummy feature disposed in the first substrate.

4. The method of claim 3, wherein the forming of the second dummy feature comprises forming a structure selected from the group consisting of a dummy gate, a dummy metal feature, a dummy isolation, a dummy device, and combinations thereof.

5. The method of claim 1, further comprising:
   forming a plurality of metal-oxide-silicon (MOS) transistors in the first substrate; and
   forming the second substrate with a structure selected from the group consisting of a mechanical supporting structure, a micro-electro-mechanical system (MEMS) device, a biosensor, and combinations thereof.

6. The method of claim 1, further comprising forming a patterned photoresist layer over the first dielectric layer having a plurality of openings to expose the first dielectric layer in the target region prior to the etching of the first dielectric layer in the target region.

7. The method of claim 1, further comprising:
   forming a second dielectric layer overlying the first dielectric layer, wherein the second dielectric layer is different from the first dielectric layer; and
   performing a preliminary CMP process on the second dielectric layer, thereby removing the second dielectric layer within the target region and exposing the first dielectric layer within the target region.

8. A method for manufacturing a microelectronic device, comprising:
   forming a first patterned layer on a first substrate, wherein the first patterned layer has a plurality of features;
   forming a first material layer on the first patterned layer;
   etching the first material layer in a target region substantially vertically aligned over the plurality of features of the first patterned layer;
   performing a chemical mechanical polishing (CMP) process on the etched first material layer; and
   after performing the CMP process, bonding the first substrate to a second substrate.

9. The method of claim 8, further comprising forming a mask over the first material layer to expose the first material layer in the target region before the etching of the first material layer.

10. The method of claim 9, wherein the forming of the mask comprises forming a patterned photoresist layer on the first material layer, the patterned photoresist layer having a plurality of openings exposing the first material layer within the target region.

11. The method of claim 9, wherein the forming of the mask comprises:
    forming a second material layer on and conformal to the first material layer, the second material layer being different form the first material layer; and
    performing a preliminary CMP process on the second material layer, thereby removing the second material layer within the target region and exposing the first material layer within the target region.

12. The method of claim 11, wherein the forming of the second material layer includes forming a silicon nitride layer by plasma enhanced chemical vapor deposition (PECVD).

13. The method of claim 11, wherein the second material layer comprises a thickness of about 1K angstrom.

14. The method of claim 11, wherein the performing of the preliminary CMP comprises reducing the second material and first material layers by a thickness ranging between about 2K and 3K angstrom.

15. The method of claim 8, wherein the first material layer comprises silicon oxide formed by high density plasma chemical vapor deposition (HDPCVD).

16. The method of claim 8, wherein the plurality of features comprises top metal features.

17. The method of claim 8, further comprising forming a supplemental layer on the first substrate after the performing of the CMP process and before the bonding.

18. The method of claim 17, wherein the supplemental layer comprises a material selected from the group consisting of silicon nitride, silicon oxide, silicon oxynitride, and combinations thereof.

19. The method of claim 17, further comprising utilizing an additional CMP process to the supplemental layer.

20. The method of claim 8, further comprising forming a supplemental layer on the first substrate after the etching of the first material layer and before the performing of the CMP process.

* * * * *